(12) United States Patent
Saruki et al.

(10) Patent No.: US 12,235,332 B2
(45) Date of Patent: *Feb. 25, 2025

(54) POSITION DETECTION DEVICE, SIGNAL PROCESSING CIRCUIT, AND MAGNETIC SENSOR SYSTEM

(71) Applicant: TDK CORPORATION, Tokyo (JP)

(72) Inventors: Shunji Saruki, Tokyo (JP); Shinichirou Mochizuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,859

(22) Filed: Apr. 25, 2023

(65) Prior Publication Data

US 2023/0266408 A1 Aug. 24, 2023

Related U.S. Application Data

(63) Continuation of application No. 16/742,984, filed on Jan. 15, 2020, now Pat. No. 11,675,025.

(30) Foreign Application Priority Data

Mar. 18, 2019 (JP) ................. 2019-049335

(51) Int. Cl.
*G01R 33/02* (2006.01)
*G01B 7/004* (2006.01)
*G01R 33/00* (2006.01)

(52) U.S. Cl.
CPC ......... *G01R 33/0206* (2013.01); *G01B 7/004* (2013.01); *G01R 33/0035* (2013.01)

(58) Field of Classification Search
CPC . G01R 33/0206; G01R 33/0035; G01B 7/004
See application file for complete search history.

(56) References Cited

U.S. PATENT DOCUMENTS 11,675,025 B2 * 6/2023 Saruki ................. G01B 21/045
702/92
2008/0116886 A1 5/2008 Yamada et al.
(Continued)

FOREIGN PATENT DOCUMENTS

| JP | 2011-185862 A | 9/2011 |
|---|---|---|
| JP | 2013-142555 A | 7/2013 |
| JP | 2018-189512 A | 11/2018 |

OTHER PUBLICATIONS

Translation of Aug. 30, 2021 Office Action issued in Chinese Patent Application No. 202010180285.7.

*Primary Examiner* — Manuel L Barbee
(74) *Attorney, Agent, or Firm* — Oliff PLC

(57) ABSTRACT

A magnetic sensor system includes a magnetic sensor device and a signal processing circuit. The magnetic sensor device generates first to third detection signals corresponding to components in three directions a field generated by a magnetic field generator that is able to change its relative position with respect to the magnetic sensor device. The signal processing circuit includes first and second processors. The second processor generates sphere information and transmits it to the first processor. When coordinates representing a set of values of the first to third detection signals in an orthogonal coordinate system are taken as a measurement point, the sphere information includes data on center coordinates of a virtual sphere having a spherical surface approximating a distribution of a plurality of measurement points. The first processor detects a change in offsets of the first to third detection signals by using the sphere information transmitted from the second processor.

8 Claims, 11 Drawing Sheets

(56) References Cited

U.S. PATENT DOCUMENTS

| | | |
|---|---|---|
| 2009/0212766 A1 | 8/2009 | Olson et al. |
| 2010/0186246 A1 | 7/2010 | Steinich et al. |
| 2012/0078562 A1 | 3/2012 | Yamada et al. |
| 2014/0184505 A1 | 7/2014 | Fullerton et al. |
| 2016/0084938 A1 | 3/2016 | Doi et al. |
| 2018/0067173 A1 | 3/2018 | Sekitsuka et al. |
| 2018/0087927 A1* | 3/2018 | Anagawa ........... G01D 5/24485 |
| 2018/0106903 A1 | 4/2018 | Iida et al. |
| 2018/0164127 A1 | 6/2018 | Anagawa et al. |

* cited by examiner

POSITION DETECTION DEVICE, SIGNAL PROCESSING CIRCUIT, AND MAGNETIC SENSOR SYSTEM

RELATED APPLICATIONS

This application is a continuation of U.S. application Ser. No. 16/742,984, filed on Jan. 15, 2020, which claims priority to Japanese Application No. 2019-049335, filed on Mar. 18, 2019, the disclosures of which are hereby incorporated by reference in their entirety.

BACKGROUND OF THE INVENTION

1. Field of the Invention

The present invention relates to a signal processing circuit for processing three detection signals, the three detection signals being output from a magnetic sensor device and having correspondences with components in three mutually different directions of a magnetic field applied to the magnetic sensor device, and to a position detection device and a magnetic sensor system each including the signal processing circuit.

2. Description of the Related Art

A magnetic sensor device for detecting components in a plurality of directions of an applied magnetic field has recently been used in a variety of applications. An example of the applications of such a magnetic sensor device is a magnetic position detection device for detecting the position of a three-dimensionally movable magnet, as disclosed in, for example, US2009/0212766A1 and JP2018-189512A.

The magnetic position detection device includes, for example, a magnetic sensor device, a magnet movable along a predetermined spherical surface around the magnetic sensor device, and a signal processing circuit. The magnetic sensor device detects three components in three mutually orthogonal directions of a magnetic field generated by the magnet and applied to the magnetic sensor device, and generates three detection signals corresponding to the three components. Based on the three detection signals, the signal processing circuit generates position information indicating the position of the magnet.

Such a magnetic position detection device can cause offsets in the three detection signals and consequently produce inaccurate position information if a disturbance magnetic field other than the magnetic field generated by the magnet is applied to the magnetic sensor device or the positional relationship between the magnetic sensor device and the magnet deviates from a desired one.

Methods for correcting offsets occurring in the three detection signals are known in the art. A typical one of the methods is as follows. Taking coordinates that represent a set of values of the three detection signals at a certain timing in a three-dimensional orthogonal coordinate system as a measurement point, a virtual sphere having a spherical surface approximating the distribution of a plurality of measurement points at a plurality of timings is determined and the center coordinates of the virtual sphere are used to correct the offsets.

JP2011-185862A describes a technique for determining the center coordinates of a new virtual sphere in response to changes in the offsets. JP2011-185862A describes a magnetic field detector including a magnetic detection section and a computing section. The magnetic detection section includes an X-axis sensor, a Y-axis sensor, and a Z-axis sensor. Based on detection outputs of the X-, Y-, and Z-axis sensors, the computing section determines a magnetic vector as a coordinate point on spherical coordinates having a center point on three-dimensional coordinates. If a predetermined number or more of shift coordinate points off the initially-set spherical coordinates are detected, the computing section determines the center point of new spherical coordinates by using the plurality of shift coordinate points. The center point of the spherical coordinates serves as a reference point of origin in expressing a magnetic vector as a coordinate point on the spherical coordinates. The spherical coordinates according to JP2011-185862A correspond to the foregoing virtual sphere. The center point of the spherical coordinates according to JP2011-185862A corresponds to the center coordinates of the foregoing virtual sphere.

Now, a case will be discussed in which the foregoing magnetic position detection device, which includes the magnetic sensor device, the magnet and the signal processing circuit, performs processing related to offset correction. The processing related to offset correction includes processing for detecting a change in the offsets, processing for determining the center coordinates of a new virtual sphere, and processing for correcting the offsets by using the center coordinates of the virtual sphere. Typically, processing for generating the position information and the processing related to the offset correction are executed by a single processor.

Corrections by such a position detection device become inaccurate if the center coordinates of the virtual sphere used in the processing for correcting the offsets are not updated when the center coordinates have changed due to a change in the offsets. The position detection device is therefore desirably capable of quickly detecting a change in the offsets.

If the processing for generating the position information and the processing related to the offset correction are all executed by a single processor as describe above, the load on the processor is high. In such a case, the processing for detecting a change in the offsets is difficult to be frequently executed. This results in a problem that a change in the offsets is not quickly detectable.

SUMMARY OF THE INVENTION

It is an object of the present invention to provide a position detection device, a signal processing circuit and a magnetic sensor system that make it possible to quickly detect a change in offsets of three detection signals having correspondences with components in three mutually different directions of a magnetic field generated by a magnetic sensor device.

A position detection device of the present invention includes a magnetic field generator that generates a predetermined magnetic field, a magnetic sensor device, and a signal processing circuit. The magnetic field generator is able to change its relative position with respect to the magnetic sensor device along a predetermined spherical surface. The magnetic sensor device generates a first detection signal, a second detection signal, and a third detection signal that have correspondences with components in three mutually different directions of a magnetic field at a reference position. The signal processing circuit includes a first processor that performs first processing related to the first to third detection signals, and a second processor that performs second processing related to the first to third detection signals.

The first processing includes sphere information reception and storage processing and offset change detection processing. The sphere information reception and storage processing includes receiving and storing sphere information transmitted from the second processor. When coordinates representing a set of values of the first to third detection signals at a certain timing in an orthogonal coordinate system defined by three axes for expressing the values of the first to third detection signals are taken as a measurement point, the sphere information includes data on center coordinates and a radius of a virtual sphere having a spherical surface approximating a distribution of a plurality of measurement points at a plurality of timings. The offset change detection processing includes detecting a change in offsets of the first to third detection signals by using the first to third detection signals and the sphere information stored by the sphere information reception and storage processing, and outputting a notification signal indicating the change in the offsets upon detection of the change.

The second processing includes sphere information generation processing, sphere information transmission processing, offset correction processing, and position information generation processing. The sphere information generation processing includes generating the sphere information by computation using the first to third detection signals. The sphere information transmission processing includes transmitting the sphere information generated by the sphere information generation processing to the first processor. The offset correction processing includes correcting the offsets of the first to third detection signals to generate first to third corrected signals by using the first to third detection signals and the data on the center coordinates included in the sphere information generated by the sphere information generation processing. The position information generation processing includes generating position information indicating the relative position of the magnetic field generator with respect to the magnetic sensor device on the basis of the first to third corrected signals.

In the position detection device of the present invention, the offset change detection processing may include determining a distance between the measurement point based on the first to third detection signals and the center coordinates included in the sphere information stored by the sphere information reception and storage processing, and determining that the offsets have changed and outputting the notification signal if a difference between the distance and the radius included in the sphere information stored by the sphere information reception and storage processing has an absolute value greater than or equal to a predetermined threshold.

In the position detection device of the present invention, the sphere information generation processing may include receiving the notification signal output by the offset change detection processing, and starting to generate latest sphere information upon receiving the notification signal.

In the position detection device of the present invention, the magnetic sensor device includes a first magnetic sensor for generating the first detection signal, a second magnetic sensor for generating the second detection signal, and a third magnetic sensor for generating the third detection signal.

In the position detection device of the present invention, the first processor may be integrated with the magnetic sensor device, and the second processor may be separate from the magnetic sensor device and the first processor.

A signal processing circuit of the present invention processes a first detection signal, a second detection signal, and a third detection signal that have correspondences with components in three mutually different directions of a magnetic field at a reference position. The first to third detection signals are output from a magnetic sensor device that generates the first to third detection signals. The signal processing circuit of the present invention includes a first processor that performs first processing related to the first to third detection signals, and a second processor that performs second processing related to the first to third detection signals.

The details of the first processing are as described above. The second processing includes sphere information generation processing and sphere information transmission processing. The sphere information generation processing includes generating the sphere information by computation using the first to third detection signals. The sphere information transmission processing includes transmitting the sphere information generated by the sphere information generation processing to the first processor.

In the signal processing circuit of the present invention, the offset change detection processing may include determining a distance between the measurement point based on the first to third detection signals and the center coordinates included in the sphere information stored by the sphere information reception and storage processing, and determining that the offsets have changed and outputting the notification signal if a difference between the distance and the radius included in the sphere information stored by the sphere information reception and storage processing has an absolute value greater than or equal to a predetermined threshold.

In the signal processing circuit of the present invention, the sphere information generation processing may include receiving the notification signal output by the offset change detection processing, and starting to generate latest sphere information upon receiving the notification signal.

In the signal processing circuit of the present invention, the second processing may further include offset correction processing. The offset correction processing may include correcting the offsets of the first to third detection signals to generate first to third corrected signals by using the first to third detection signals and the data on the center coordinates included in the sphere information generated by the sphere information generation processing.

A magnetic sensor system of the present invention includes a magnetic sensor device, and the signal processing circuit of the present invention. The magnetic sensor device includes a first magnetic sensor for generating the first detection signal, a second magnetic sensor for generating the second detection signal, and a third magnetic sensor for generating the third detection signal.

According to the position detection device, the signal processing circuit and the magnetic sensor system of the present invention, the first processor detects a change in the offsets of the first to third detection signals by using the sphere information generated by the second processor, without performing the processing for generating the sphere information by itself. The present invention thus enables quick detection of a change in the offsets of the first to third detection signals.

Other and further objects, features and advantages of the present invention will appear more fully from the following description.

DETAILED DESCRIPTION OF THE PREFERRED EMBODIMENT

Figure 1:
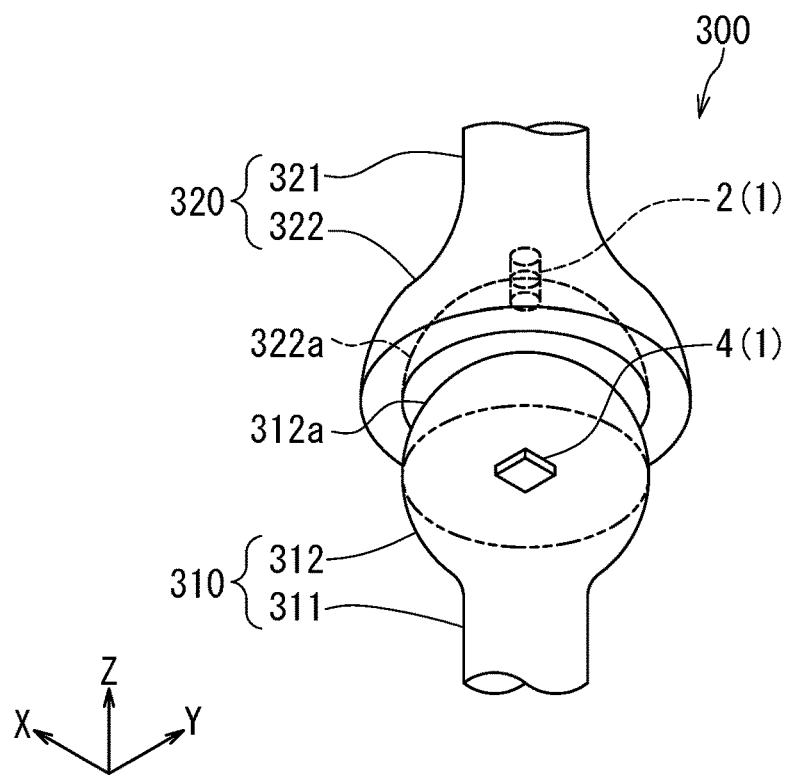
FIG. 1 is a perspective view illustrating a schematic configuration of a joint mechanism including a position detection device according to an embodiment of the invention.
Figure 2:
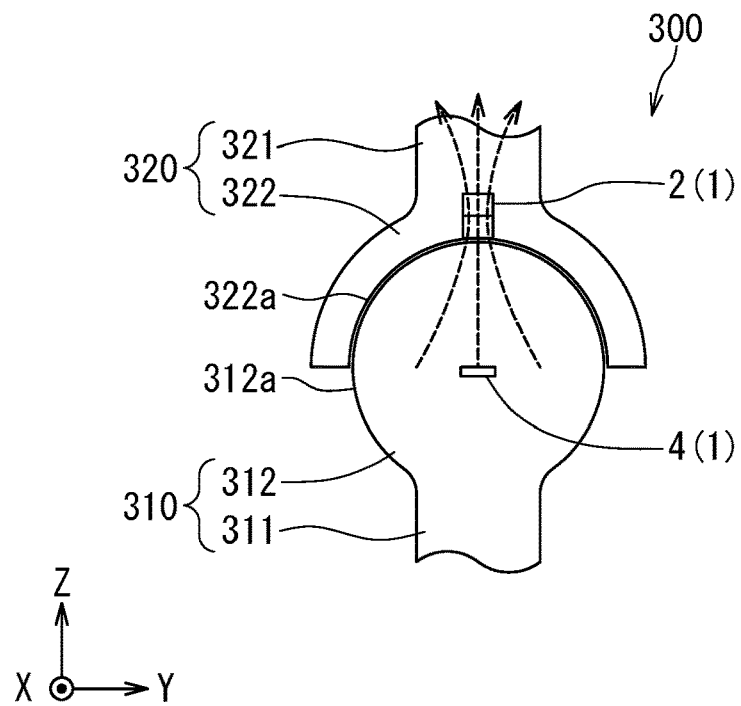
FIG. 2 is a cross-sectional view illustrating the schematic configuration of the joint mechanism illustrated in FIG. 1.
Figure 3:
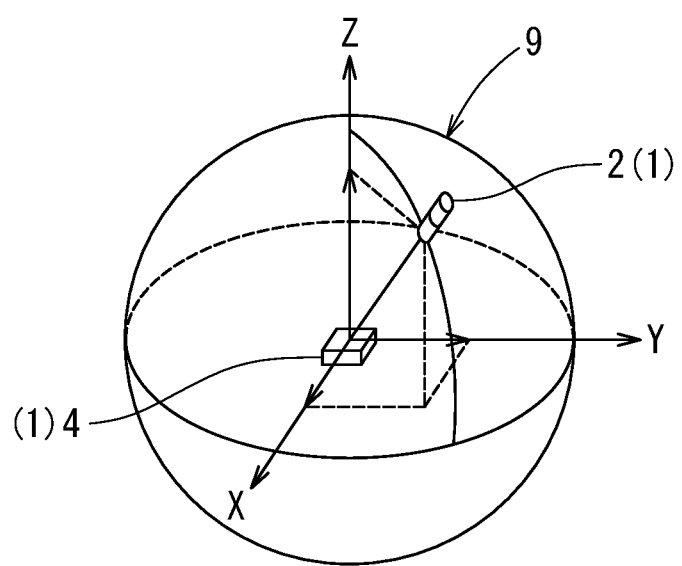
FIG. 3 is an explanatory diagram for describing a reference coordinate system in the position detection device according to the embodiment of the invention.
Figure 4:
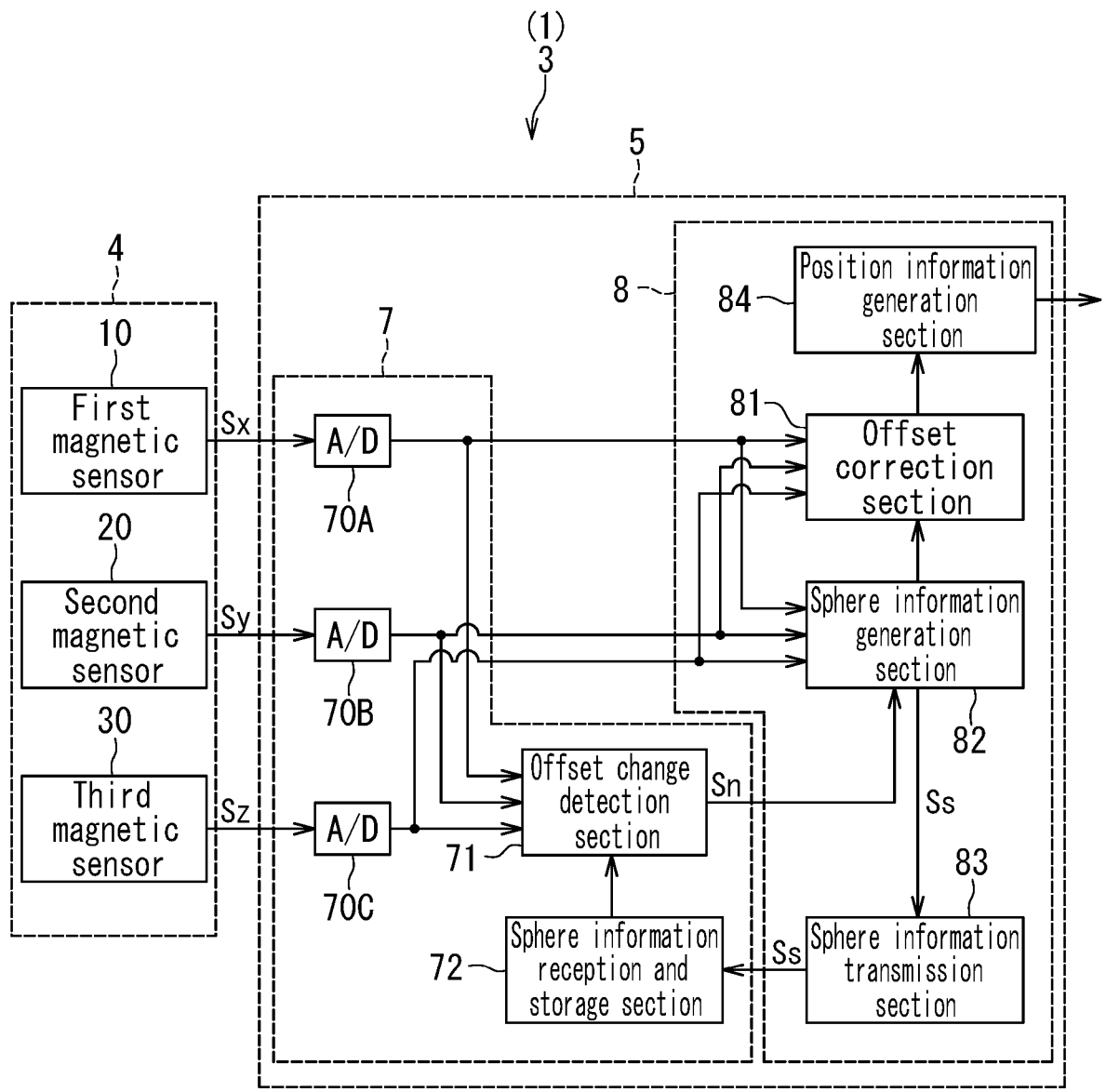
FIG. 4 is a functional block diagram illustrating a configuration of a magnetic sensor system according to the embodiment of the invention.

A preferred embodiment of the present invention will now be described in detail with reference to the drawings. First, a description will be given of a joint mechanism 300 with a position detection device 1 according to the embodiment of the invention applied thereto. The joint mechanism 300 is a mechanism including a joint. FIG. 1 is a perspective view illustrating a schematic configuration of the joint mechanism 300. FIG. 2 is a cross-sectional view illustrating the schematic configuration of the joint mechanism 300. FIG. 3 is an explanatory diagram for describing a reference coordinate system in the position detection device 1. FIG. 4 is a functional block diagram illustrating a configuration of a magnetic sensor system according to the embodiment of the invention.

As illustrated in FIGS. 1 and 2, the joint mechanism 300 includes a first member 310, a second member 320, and the position detection device 1.

The first member 310 includes a shaft portion 311 and a spherical portion 312 coupled to one longitudinal end of the shaft portion 311. The spherical portion 312 includes a convex surface 312a. The convex surface 312a is constituted of part of a first spherical surface. A portion of the first spherical surface that is not included in the convex surface 312a is a border portion between the shaft portion 311 and the spherical portion 312.

The second member 320 includes a shaft portion 321 and a receptor portion 322 coupled to one longitudinal end of the shaft portion 321. The receptor portion 322 includes a concave surface 322a. The concave surface 322a is constituted of part of a second spherical surface. The concave surface 322a may be constituted of one half or almost one half of the second spherical surface.

With the spherical portion 312 fitted into the receptor portion 322, the first member 310 and the second member 320 are coupled to each other such that their positional relationship is changeable. The second spherical surface has a radius slightly greater than or equal to that of the first spherical surface. The convex surface 312a and the concave surface 322a may be in contact with each other, or opposed to each other with a lubricant therebetween. The center of the second spherical surface coincides or almost coincides with that of the first spherical surface. The coupling portion between the first and second members 310 and 320 is the joint. In the present embodiment, the joint is a ball-and-socket joint.

The position detection device 1 includes a magnetic field generator 2 and a magnetic sensor device 4. The position detection device 1 further includes a signal processing circuit 5 according to the present embodiment illustrated in FIG. 4. As illustrated in FIG. 4, the magnetic sensor device 4 and the signal processing circuit 5 constitute a magnetic sensor system 3 according to the embodiment. The position detection device 1 can thus be said to include the magnetic field generator 2 and the magnetic sensor system 3.

The magnetic field generator 2 is able to change its relative position with respect to the magnetic sensor device 4 along a predetermined spherical surface. The position detection device 1 is a device for detecting the relative position of the magnetic field generator 2 with respect to the magnetic sensor device 4.

The magnetic field generator 2 generates a predetermined magnetic field. An example of the magnetic field generator 2 is a magnet. The magnetic sensor device 4 generates a first detection signal, a second detection signal and a third detection signal that have correspondences with components in three mutually different directions of a magnetic field at a reference position. The reference position will be described in detail later.

The signal processing circuit 5 processes the first to third detection signals and generates position information indicating the relative position of the magnetic field generator 2 with respect to the magnetic sensor device 4.

As illustrated in FIGS. 1 and 2, the magnetic field generator 2 is embedded in the receptor portion 322 so as not to protrude from the concave surface 322a. The magnetic sensor device 4 is located inside the spherical portion 312. Hereinafter, the position of the center of the first spherical surface will be referred to as a reference position. The magnetic sensor device 4 is configured to detect a magnetic field at the reference position.

Hereinafter, a magnetic field that is a portion of the magnetic field generated by the magnetic field generator 2 and that is at the reference position will be referred to as a target magnetic field. For example, the direction of the target magnetic field is parallel to a virtual straight line passing through the reference position and the magnetic field generator 2. In the example illustrated in FIG. 2, the magnetic field generator 2 is a magnet having an N pole and an S pole arranged along the foregoing virtual straight line. The S pole is located closer to the reference position than the N pole is. The plurality of arrowed broken lines in FIG. 2 represent magnetic lines of force corresponding to the magnetic field generated by the magnetic field generator 2.

The joint mechanism 300 illustrated in FIGS. 1 and 2 is able to change the relative position of the second member 320 with respect to the first member 310, with the spherical portion 312 fitted into the receptor portion 322. This allows the magnetic field generator 2 to be able to change its relative position with respect to the magnetic sensor device 4 along the foregoing predetermined spherical surface. In the present embodiment, the relative position of the magnetic field generator 2 with respect to the magnetic sensor device 4 is represented by the position of a point closest to the reference position on the magnetic field generator 2. The center of the predetermined spherical surface coincides or almost coincides with the center of the first spherical surface. The predetermined spherical surface has a radius greater than or equal to that of the first spherical surface. The radius of the predetermined spherical surface may coincide with that of the first spherical surface or that of the second spherical surface.

Now, a description will be given of a reference coordinate system in the present embodiment with reference to FIG. 3. The reference coordinate system is an orthogonal coordinate system that is set with reference to the magnetic sensor device 4 and defined by three axes for expressing the values of the first to third detection signals. An X direction, a Y direction, and a Z direction are defined in the reference coordinate system. As illustrated in FIG. 3, the X, Y, and X directions are orthogonal to each other. The opposite directions to the X, Y, and Z directions will be expressed as −X, −Y, and −Z directions, respectively.

As described above, the magnetic sensor device 4 generates the first, second, and third detection signals having correspondences with the components in three mutually different directions of the magnetic field at the reference position. In the present embodiment, specifically, the three mutually different directions are a direction parallel to the X direction, a direction parallel to the Y direction, and a direction parallel to the Z direction. The three axes defining the reference coordinate system are an axis parallel to the X direction, an axis parallel to the Y direction, and an axis parallel to the Z direction.

The position of the magnetic sensor device 4 in the reference coordinate system remains unchanged. As the relative position of the magnetic field generator 2 with respect to the magnetic sensor device 4 changes, the position of the magnetic field generator 2 in the reference coordinate system changes along the foregoing predetermined spherical surface. In FIG. 3, the reference numeral 9 designates the predetermined spherical surface. The position of the magnetic field generator 2 in the reference coordinate system indicates the relative position of the magnetic field generator 2 with respect to the magnetic sensor device 4. Hereinafter, the position of the magnetic field generator 2 in the reference coordinate system will be simply referred to as the position of the magnetic field generator 2. An XY plane including the reference position will be referred to as a reference plane.

In the joint mechanism 300 including the position detection device 1, the position detection device 1 detects the relative position of the magnetic field generator 2 with respect to the magnetic sensor device 4, thereby enabling detection of the relative position of the second member 320 with respect to the first member 310. The joint mechanism 300 is used for robots, industrial equipment, medical equipment, amusement equipment, etc.

The position detection device 1 is applicable not only to the joint mechanism 300 but also to joysticks and trackballs.

A joystick includes, for example, a lever and a supporter that swingably supports the lever. In the case of applying the position detection device 1 to the joystick, for example, the magnetic field generator 2 is provided inside the supporter and the magnetic sensor device 4 is provided inside the lever so that the relative position of the magnetic field generator 2 with respect to the magnetic sensor device 4 changes along a predetermined spherical surface as the lever swings.

A trackball includes, for example, a ball and a supporter that rotatably supports the ball. In the case of applying the position detection device 1 to the trackball, for example, the magnetic field generator 2 is provided inside the supporter and the magnetic sensor device 4 is provided inside the ball so that the relative position of the magnetic field generator 2 with respect to the magnetic sensor device 4 changes along a predetermined spherical surface as the ball rotates.

Reference is now made to FIG. 4 to describe a configuration of the magnetic sensor device 4 and the signal processing circuit 5. The magnetic sensor device 4 generates the first detection signal Sx, the second detection signal Sy and the third detection signal Sz having correspondences with components in three mutually different directions of the target magnetic field. In the present embodiment, the first detection signal Sx has a correspondence with a first component of the target magnetic field. The first component is a component in a first sensing direction. The second detection signal Sy has a correspondence with a second component of the target magnetic field. The second component is a component in a second sensing direction. The third detection signal Sz has a correspondence with a third component of the target magnetic field. The third component is a component in a third sensing direction.

In the present embodiment, the magnetic sensor device 4 includes a first magnetic sensor 10 for generating the first detection signal Sx, a second magnetic sensor 20 for generating the second detection signal Sy, and a third magnetic sensor 30 for generating the third detection signal Sz. Each of the first to third magnetic sensors 10, 20 and 30 includes at least one magnetic detection element.

The signal processing circuit 5 includes a first processor 7 and a second processor 8. The first processor 7 performs first processing related to the first to third detection signals Sx, Sy and Sz. The second processor 8 performs second processing related to the first to third detection signals Sx, Sy and Sz.

In the present embodiment, hardware that constitutes the first processor 7 is different from that constituting the second processor 8. For example, the first processor 7 is constructed of an application-specific integrated circuit (ASIC). For example, the second processor 8 is constructed of a microcomputer.

Next, a configuration of the magnetic sensor device 4 and the first processor 7 will be described. In the present embodiment, the magnetic sensor device 4 is configured as a first chip. The first processor 7 is configured as a second chip different from the first chip. The first processor 7 may be integrated with the magnetic sensor device 4. The second processor 8 may be separate from the magnetic sensor device 4 and the first processor 7. In the present embodiment, an integral unit of the magnetic sensor device 4 and the first processor 7 will be referred to as a magnetic sensor assembly 200.

Figure 5:
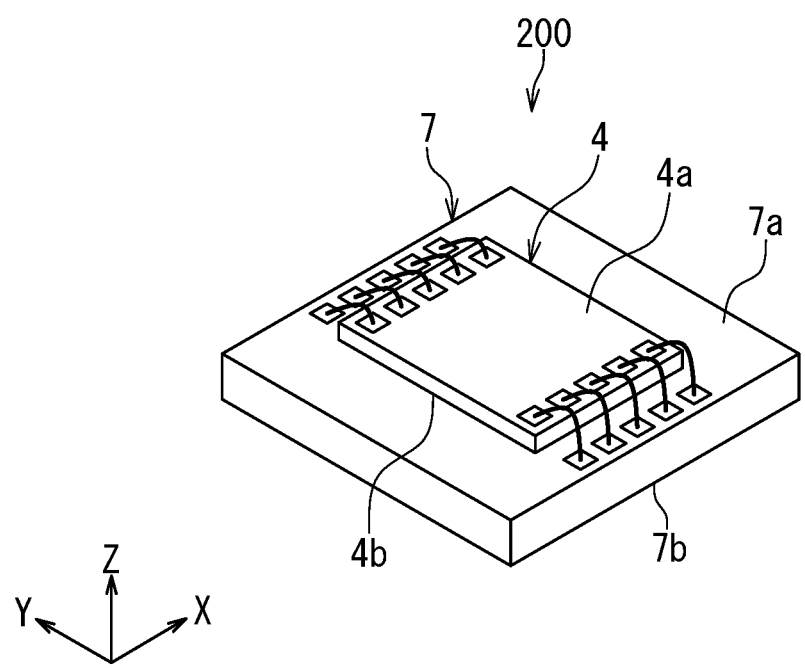
FIG. 5 is a perspective view illustrating a magnetic sensor assembly of the embodiment of the invention.

FIG. 5 is a perspective view of the magnetic sensor assembly 200. As illustrated in FIG. 5, both the magnetic sensor device 4 and the first processor 7 have a rectangular parallelepiped shape. The magnetic sensor device 4 and the first processor 7 have their respective outer surfaces.

The outer surfaces of the magnetic sensor device 4 include a top surface 4a and a bottom surface 4b opposite to each other, and four side surfaces connecting the top surface 4a and the bottom surface 4b. The outer surfaces of the first processor 7 include a top surface 7a and a bottom surface 7b opposite to each other, and four side surfaces connecting the top surface 7a and the bottom surface 7b. The magnetic sensor device 4 is mounted on the top surface 7a of the first processor 7 in such an orientation that the bottom surface 4b faces the top surface 7a.

The magnetic sensor device 4 has a group of terminals provided on the top surface 4a. The first processor 7 has a group of terminals provided on the top surface 7a. The group of terminals of the magnetic sensor device 4 is connected to the group of terminals of the first processor 7 via a plurality of bonding wires, for example.

Figure 6:
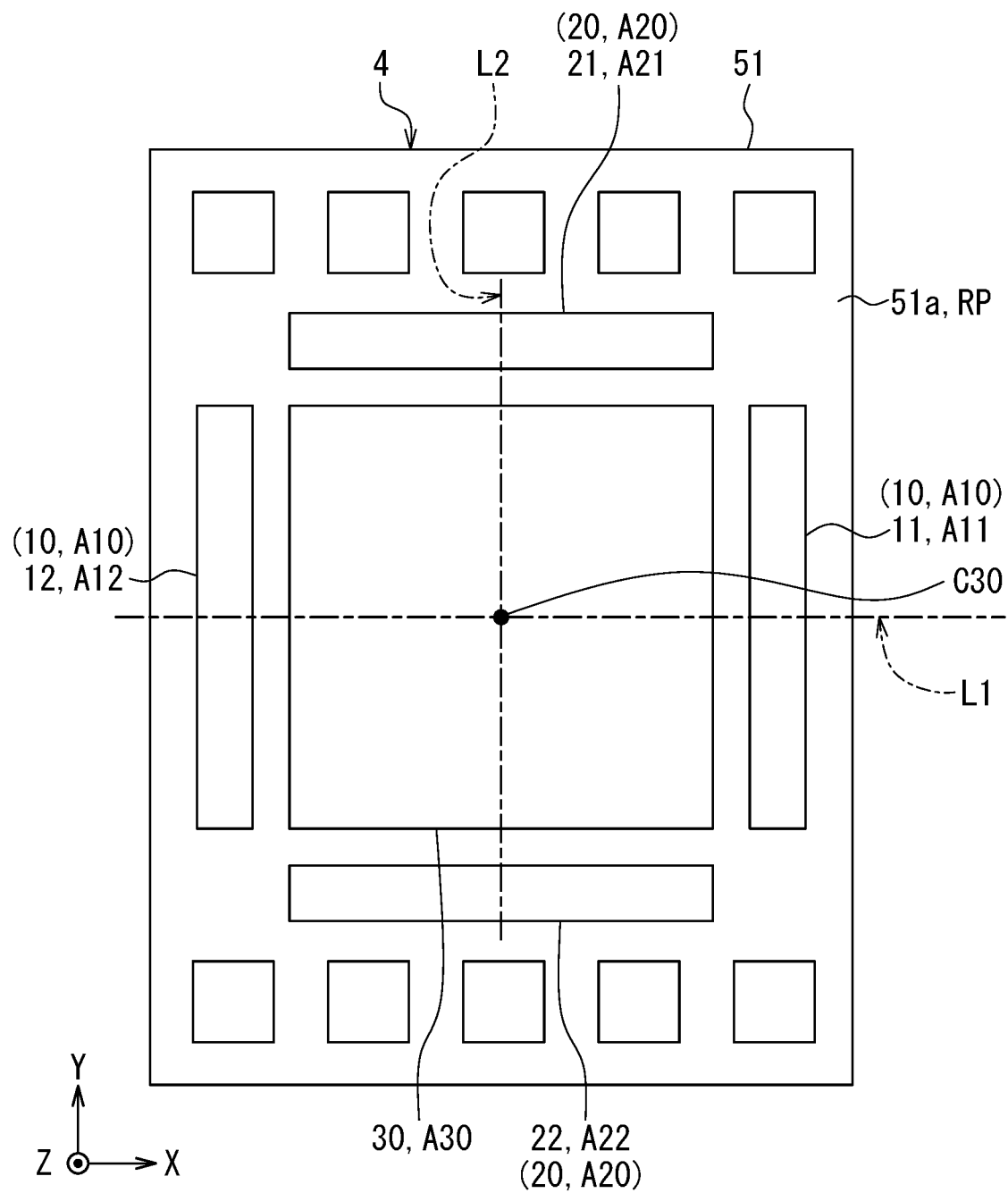
FIG. 6 is a plan view illustrating a magnetic sensor device of the embodiment of the invention.
Figure 12:
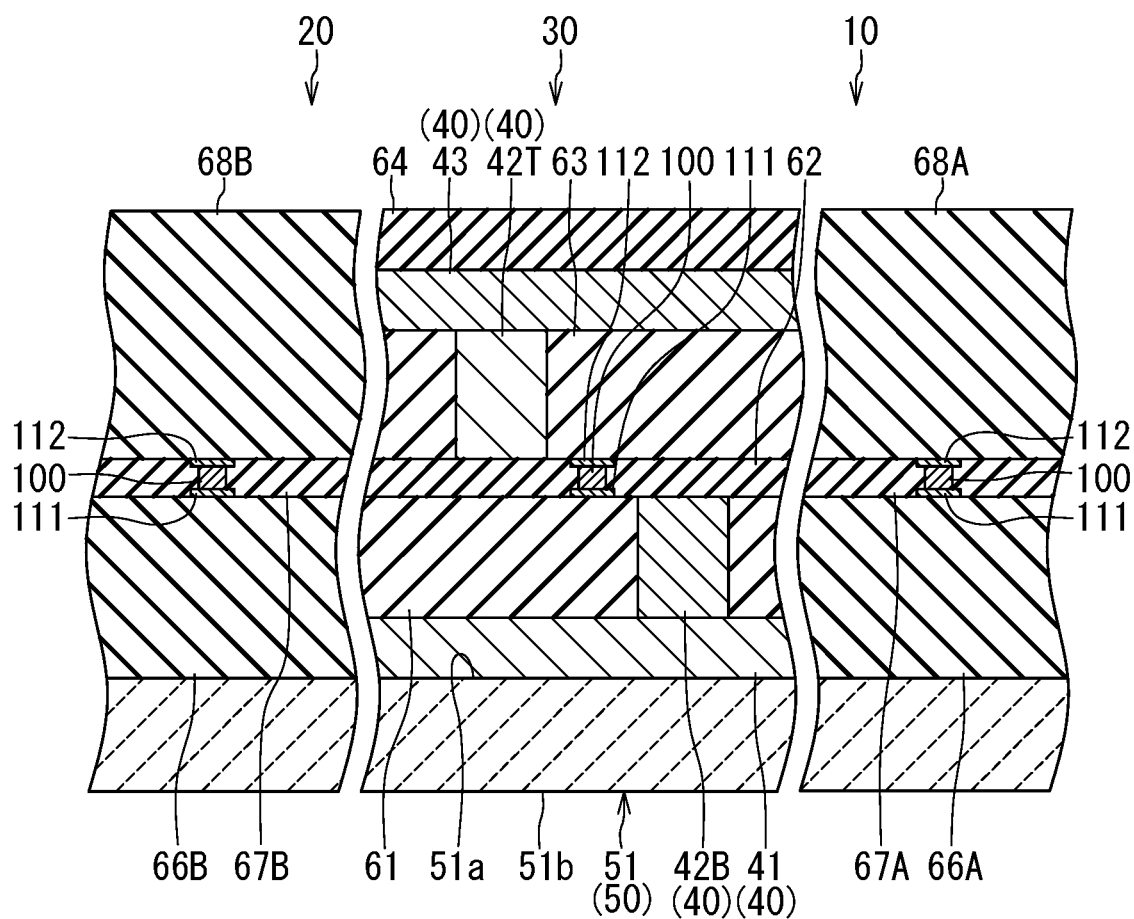
FIG. 12 is a cross-sectional view illustrating respective portions of first to third magnetic sensors and a soft magnetic structure of the embodiment of the invention.

Next, the layout of the first to third magnetic sensors 10, 20 and 30 will be described with reference to FIG. 6. FIG. 6 is a plan view of the magnetic sensor device 4. As illustrated in FIG. 6, the magnetic sensor device 4 includes the first to third magnetic sensors 10, 20 and 30, a substrate 51 supporting the first to third magnetic sensors 10, 20 and 30, and the group of terminals. The substrate 51 has a top surface 51a and a bottom surface 51b. The bottom surface 51b is illustrated in FIG. 12 to be described later.

Now, a relationship of the components of the magnetic sensor device 4 with the reference coordinate system and the reference plane will be described with reference to FIG. 6. As described above, the X, Y, Z, −X, −Y, and −Z directions are defined in the reference coordinate system. The X and Y directions are parallel to the top surface 51a of the substrate 51. The Z direction is perpendicular to the top surface 51a of the substrate 51, and directed from the bottom surface 51b to the top surface 51a of the substrate 51. Hereinafter, the term "above" refers to positions located forward of a reference position in the Z direction, and "below" refers to positions opposite from the "above" positions with respect to the reference position. For each component of the magnetic sensor device 4, the term "top surface" refers to a surface of the component lying at the end thereof in the Z direction, and "bottom surface" refers to a surface of the component lying at the end thereof in the −Z direction.

In the present embodiment, the top surface 51a of the substrate 51 is the reference plane. Hereinafter, the reference plane will be denoted by the symbol RP. The reference plane RP includes three different areas: a first area A10; a second area A20; and a third area A30. The first area A10 is an area formed by vertically projecting the first magnetic sensor 10 onto the reference plane RP. The second area A20 is an area formed by vertically projecting the second magnetic sensor 20 onto the reference plane RP. The third area A30 is an area formed by vertically projecting the third magnetic sensor 30 onto the reference plane RP.

Here, two mutually orthogonal straight lines that are located in the reference plane RP, pass through the centroid C30 of the third area A30 and are perpendicular to the Z direction will be referred to as a first straight line L1 and a second straight line L2. In the present embodiment, specifically, the first straight line L1 is parallel to the X direction, and the second straight line L2 is parallel to the Y direction.

In the present embodiment, the first magnetic sensor 10 includes a first portion 11 and a second portion 12 located at different positions from each other in the X direction. The first area A10 includes a first partial area A11 formed by vertically projecting the first portion 11 of the first magnetic sensor 10 onto the reference plane RP, and a second partial area A12 formed by vertically projecting the second portion 12 of the first magnetic sensor 10 onto the reference plane RP. The first and second partial areas A11 and A12 are located on opposite sides of the third area A30 in a direction parallel to the first straight line L1.

The second magnetic sensor 20 includes a first portion 21 and a second portion 22 located at different positions from each other in the Y direction. The second area A20 includes a third partial area A21 formed by vertically projecting the first portion 21 of the second magnetic sensor 20 onto the reference plane RP, and a fourth partial area A22 formed by vertically projecting the second portion 22 of the second magnetic sensor 20 onto the reference plane RP. The third and fourth partial areas A21 and A22 are located on opposite sides of the third area A30 in a direction parallel to the second straight line L2.

In the present embodiment, both the first and second partial areas A11 and A12 are located to be intersected by the first straight line L1. Both the third and fourth partial areas A21 and A22 are located to be intersected by the second straight line L2.

It is desirable that no portion of the first area A10 be intersected by the second straight line L2. Likewise, it is desirable that no portion of the second area A20 be intersected by the first straight line L1.

In the present embodiment, in particular, the first area A10 and the second area A20 as viewed from above have such a positional relationship that the first area A10 coincides with the second area A20 if the first area A10 is rotated 90° around the centroid C30 of the third area A30. In FIG. 6, if the first and second partial areas A11 and A12 are rotated 90° counterclockwise around the centroid C30, the first and second partial areas A11 and A12 coincide with the third and fourth partial areas A21 and A22, respectively.

Figure 7:
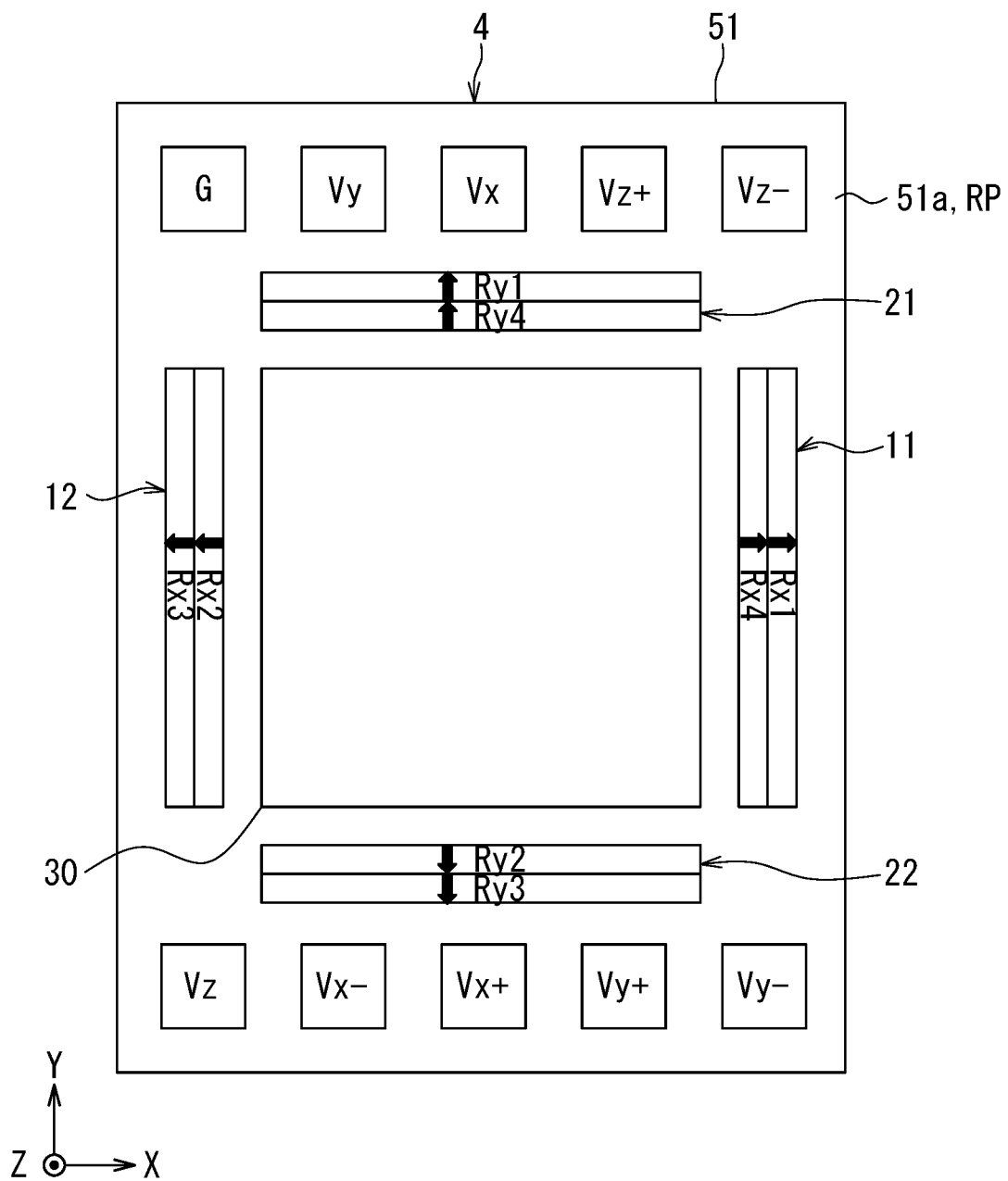
FIG. 7 is an explanatory diagram illustrating a configuration of the magnetic sensor device of the embodiment of the invention.
Figure 8:
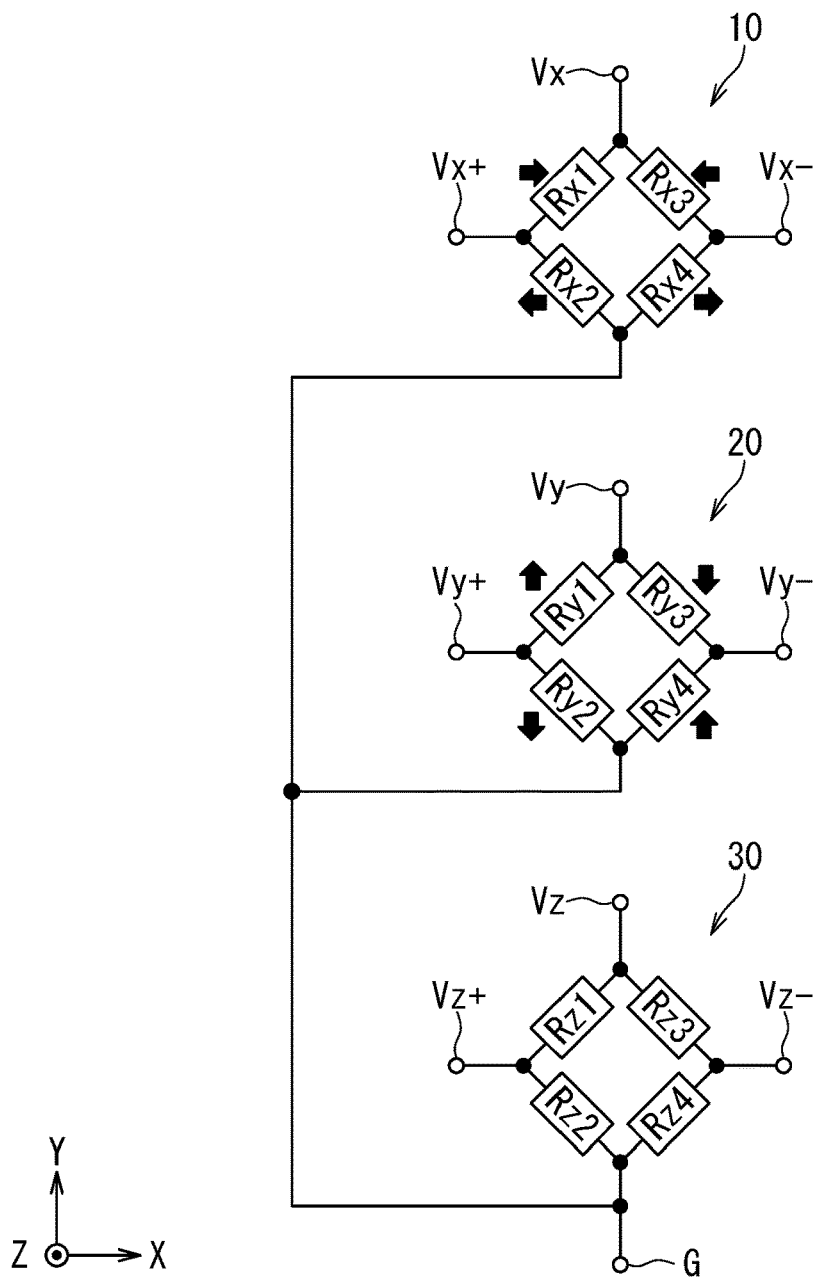
FIG. 8 is a circuit diagram illustrating an example of a circuit configuration of the magnetic sensor device of the embodiment of the invention.

An example configuration of the magnetic sensor device 4 will now be described with reference to FIG. 7 and FIG. 8. FIG. 7 is an explanatory diagram illustrating the configuration of the magnetic sensor device 4. FIG. 8 is a circuit diagram illustrating an example of a circuit configuration of the magnetic sensor device 4.

As described above, the first magnetic sensor 10 generates the first detection signal Sx having a correspondence with the first component, i.e., a component in the first sensing direction, of the target magnetic field. The second magnetic sensor 20 generates the second detection signal Sy having a correspondence with the second component, i.e., a component in the second sensing direction, of the target magnetic field. The third magnetic sensor 30 generates the third detection signal Sz having a correspondence with the third component, i.e., a component in the third sensing direction, of the target magnetic field.

In the present embodiment, specifically, the first sensing direction is a direction parallel to the X direction. The first sensing direction includes the X direction and the −X direction. The second sensing direction is a direction parallel to the Y direction. The second sensing direction includes the Y direction and the −Y direction. The third sensing direction is a direction parallel to the Z direction. The third sensing direction includes the Z direction and the −Z direction.

As illustrated in FIG. 7, the group of terminals of the magnetic sensor device 4 includes: a power supply terminal Vx and output terminals Vx+ and Vx− associated with the first magnetic sensor 10; a power supply terminal Vy and output terminals Vy+ and Vy− associated with the second magnetic sensor 20; a power supply terminal Vz and output terminals Vz+ and Vz− associated with the third magnetic sensor 30; and a ground terminal G shared among the first to third magnetic sensors 10, 20 and 30.

In the example illustrated in FIG. 8, the first magnetic sensor 10 includes four resistor sections Rx1, Rx2, Rx3 and Rx4 constituting a Wheatstone bridge circuit. Each of the resistor sections Rx1, Rx2, Rx3 and Rx4 has a resistance that varies depending on the first component of the target magnetic field. The resistor section Rx1 is provided between the power supply terminal Vx and the output terminal Vx+. The resistor section Rx2 is provided between the output terminal Vx+ and the ground terminal G. The resistor section Rx3 is provided between the power supply terminal Vx and the output terminal Vx−. The resistor section Rx4 is provided between the output terminal Vx− and the ground terminal G.

The second magnetic sensor 20 includes four resistor sections Ry1, Ry2, Ry3 and Ry4 constituting a Wheatstone bridge circuit. Each of the resistor sections Ry1, Ry2, Ry3 and Ry4 has a resistance that varies depending on the second component of the target magnetic field. The resistor section Ry1 is provided between the power supply terminal Vy and the output terminal Vy+. The resistor section Ry2 is provided between the output terminal Vy+ and the ground terminal G. The resistor section Ry3 is provided between the power supply terminal Vy and the output terminal Vy−. The resistor section Ry4 is provided between the output terminal Vy− and the ground terminal G.

The third magnetic sensor 30 includes four resistor sections Rz1, Rz2, Rz3 and Rz4 constituting a Wheatstone bridge circuit. Each of the resistor sections Rz1, Rz2, Rz3 and Rz4 has a resistance that varies depending on an output magnetic field component output from a magnetic field conversion section, which will be described later. The resistor section Rz1 is provided between the power supply terminal Vz and the output terminal Vz+. The resistor section Rz2 is provided between the output terminal Vz+ and the ground terminal G. The resistor section Rz3 is provided between the power supply terminal Vz and the output terminal Vz−. The resistor section Rz4 is provided between the output terminal Vz− and the ground terminal G.

Hereinafter, the term "resistor section R" is used to refer to any one of the resistor sections Rx1, Rx2, Rx3, Rx4, Ry1, Ry2, Ry3, Ry4, Rz1, Rz2, Rz3, and Rz4. Each resistor section R includes at least one magnetic detection element. In the present embodiment, the at least one magnetic detection element is specifically at least one magnetoresistive element. The magnetoresistive element will hereinafter be referred to as MR element.

In the present embodiment, the MR element is specifically a spin-valve MR element. The spin-valve MR element includes a magnetization pinned layer having a magnetization in a fixed direction, a free layer having a magnetization whose direction is variable depending on the direction of an applied magnetic field, and a gap layer located between the magnetization pinned layer and the free layer. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°. In each MR element, the free layer has a shape anisotropy that sets the direction of the magnetization easy axis to be orthogonal to the magnetization direction of the magnetization pinned layer.

In FIG. 8, the filled arrows indicate the magnetization directions of the magnetization pinned layers of the MR elements. In the example illustrated in FIG. 8, the magnetization pinned layers of the MR elements in each of the resistor sections Rx1 and Rx4 are magnetized in the X direction. The magnetization pinned layers of the MR elements in each of the resistor sections Rx2 and Rx3 are magnetized in the −X direction.

The magnetization pinned layers of the MR elements in each of the resistor sections Ry1 and Ry4 are magnetized in the Y direction. The magnetization pinned layers of the MR elements in each of the resistor sections Ry2 and Ry3 are magnetized in the −Y direction. The magnetization directions of the magnetization pinned layers of the MR elements in each of the resistor sections Rz1, Rz2, Rz3 and Rz4 will be described later.

A potential difference between the output terminals Vx+ and Vx− has a correspondence with the first component of the target magnetic field. The first magnetic sensor 10 generates the first detection signal Sx corresponding to the potential difference between the output terminals Vx+ and Vx−. The first detection signal Sx may be one obtained by adjusting the amplitude or offset of the potential difference between the output terminals Vx+ and Vx−.

A potential difference between the output terminals Vy+ and Vy− has a correspondence with the second component of the target magnetic field. The second magnetic sensor 20 generates the second detection signal Sy corresponding to the potential difference between the output terminals Vy+ and Vy−. The second detection signal Sy may be one obtained by adjusting the amplitude or offset of the potential difference between the output terminals Vy+ and Vy−.

A potential difference between the output terminals Vz+ and Vz− has a correspondence with the third component of the target magnetic field. The third magnetic sensor 30 generates the third detection signal Sz corresponding to the potential difference between the output terminals Vz+ and Vz−. The third detection signal Sz may be one obtained by adjusting the amplitude or offset of the potential difference between the output terminals Vz+ and Vz−.

Reference is now made to FIG. 7 to describe an example layout of the resistor sections Rx1, Rx2, Rx3, Rx4, Ry1, Ry2, Ry3, and Ry4. In this example, the first portion 11 of the first magnetic sensor 10 includes the resistor sections Rx1 and Rx4, and the second portion 12 of the first magnetic sensor 10 includes the resistor sections Rx2 and Rx3. The first portion 21 of the second magnetic sensor 20 includes the resistor sections Ry1 and Ry4, and the second portion 22 of the second magnetic sensor includes the resistor sections Ry2 and Ry3.

In FIG. 7, the filled arrows indicate the magnetization directions of the magnetization pinned layers of the MR elements. In the example illustrated in FIG. 7, in each of the first portion 11 of the first magnetic sensor 10, the second portion 12 of the first magnetic sensor 10, the first portion 21 of the second magnetic sensor 20, and the second portion 22 of the second magnetic sensor 20, the magnetization pinned layers of the MR elements included therein have the same magnetization direction. Such an example makes it easy to set the magnetization directions of the magnetization pinned layers in a plurality of MR elements.

An example configuration of MR elements will now be described with reference to FIG. 9. An MR element 100 illustrated in FIG. 9 includes an antiferromagnetic layer 101, a magnetization pinned layer 102, a gap layer 103, and a free layer 104 which are stacked in this order, from closest to farthest from the substrate 51. The antiferromagnetic layer 101 is formed of an antiferromagnetic material, and is in exchange coupling with the magnetization pinned layer 102 to thereby pin the magnetization direction of the magnetization pinned layer 102.

Figure 9:
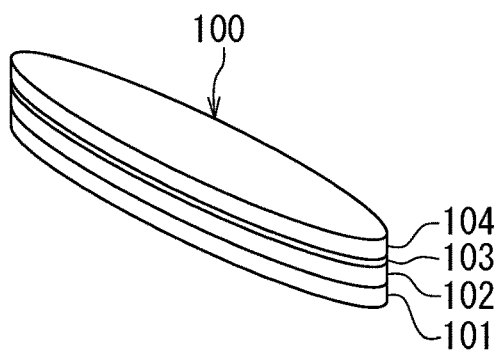
FIG. 9 is a perspective view illustrating a magnetoresistive element of the embodiment of the invention.

The layers 101 to 104 of the MR element 100 may be stacked in the reverse order to that illustrated in FIG. 9. The magnetization pinned layer 102 need not necessarily be a single ferromagnetic layer but may have an artificial antiferromagnetic structure including two ferromagnetic layers and a nonmagnetic metal layer interposed between the two ferromagnetic layers. The MR element 100 may be configured without the antiferromagnetic layer 101. The magnetic detection element may be an element for detecting a magnetic field other than the MR element, such as a Hall element or a magnetic impedance element.

Figure 10:
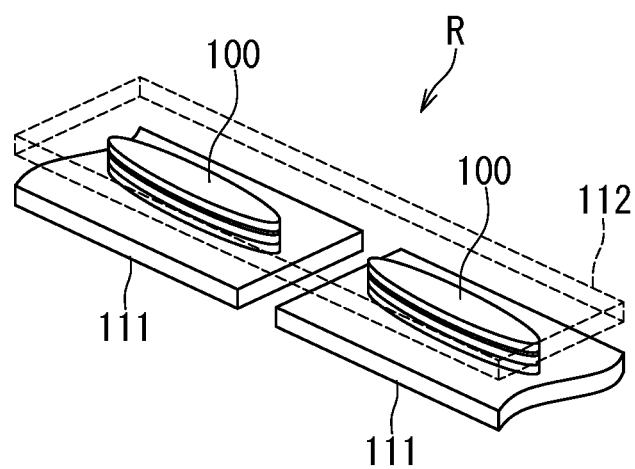
FIG. 10 is a perspective view illustrating part of a resistor section of the embodiment of the invention.

Next, an example configuration of the resistor section R will be described with reference to FIG. 10. In this example, the resistor section R includes a plurality of MR elements 100 connected in series. The resistor section R further includes one or more connection layers for electrically connecting two MR elements 100 that are adjacent to each other in circuit configuration, so that the plurality of MR elements 100 are connected in series. In the example illustrated in FIG. 10 the resistor section R includes, as the one or more connection layers, one or more lower connection layers 111 and one or more upper connection layers 112. The lower connection layer 111 is in contact with the bottom surfaces of two MR elements 100 adjacent to each other in circuit configuration, and electrically connects the two MR elements 100. The upper connection layer 112 is in contact with the top surfaces of two MR elements 100 adjacent to each other in circuit configuration, and electrically connects the two MR elements 100.

Next, an example configuration of the third magnetic sensor 30 will be described with reference to FIG. 11. The third magnetic sensor 30 includes a soft magnetic structure 40 formed of a soft magnetic material, in addition to the resistor sections Rz1, Rz2, Rz3 and Rz4. The soft magnetic structure 40 includes a magnetic field conversion section 42 and at least one soft magnetic layer. The magnetic field conversion section 42 receives the third component of the target magnetic field and outputs an output magnetic field component that is in a direction perpendicular to the third sensing direction. The strength of the output magnetic field component has a correspondence with the strength of the third component of the target magnetic field. The third magnetic sensor 30 detects the strength of the third component of the target magnetic field by detecting the strength of the output magnetic field component.

Figure 11:
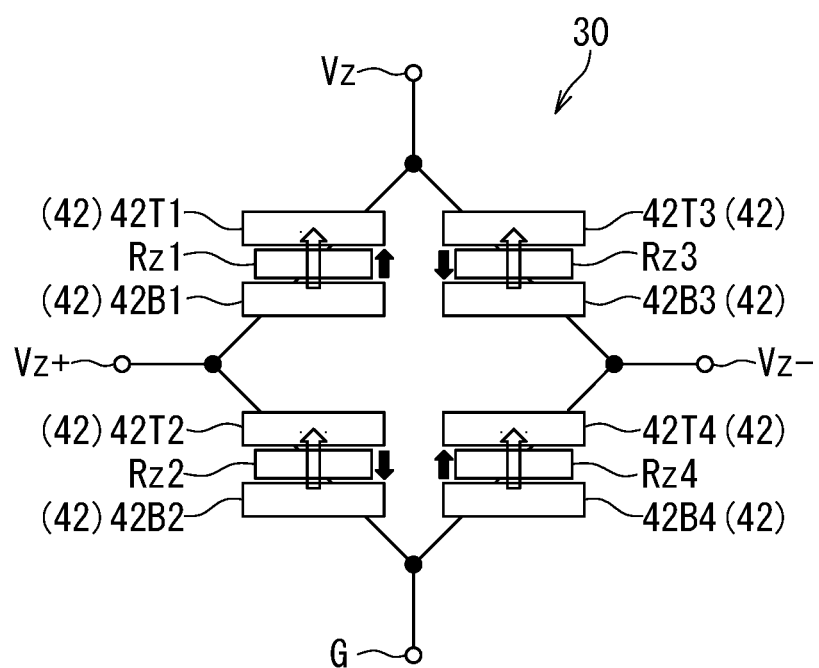
FIG. 11 is an explanatory diagram illustrating configurations of a magnetic field conversion section and a third magnetic sensor of the embodiment of the invention.

In the example illustrated in FIG. 11, the magnetic field conversion section 42 includes: a lower yoke 42B1 and an upper yoke 42T1 associated with the resistor section Rz1; a lower yoke 42B2 and an upper yoke 42T2 associated with the resistor section Rz2; a lower yoke 42B3 and an upper yoke 42T3 associated with the resistor section Rz3; and a lower yoke 42B4 and an upper yoke 42T4 associated with the resistor section Rz4.

The lower yokes 42B1, 42B2, 42B3 and 42B4 and the upper yokes 42T1, 42T2, 42T3 and 42T4 each have a rectangular parallelepiped shape elongated in a direction perpendicular to the Z direction.

The lower yoke 42B1 and the upper yoke 42T1 are located near the resistor section Rz1. The lower yoke 42B1 is located closer to the top surface 51a of the substrate 51 than the resistor section Rz1. The upper yoke 42T1 is located farther from the top surface 51a of the substrate 51 than the resistor section Rz1. As viewed from above, the resistor section Rz1 lies between the lower yoke 42B1 and the upper yoke 42T1.

The lower yoke 42B2 and the upper yoke 42T2 are located near the resistor section Rz2. The lower yoke 42B2 is located closer to the top surface 51a of the substrate 51 than the resistor section Rz2. The upper yoke 42T2 is located farther from the top surface 51a of the substrate 51 than the resistor section Rz2. As viewed from above, the resistor section Rz2 lies between the lower yoke 42B2 and the upper yoke 42T2.

The lower yoke 42B3 and the upper yoke 42T3 are located near the resistor section Rz3. The lower yoke 42B3 is located closer to the top surface 51a of the substrate 51 than the resistor section Rz3. The upper yoke 42T3 is located farther from the top surface 51a of the substrate 51 than the resistor section Rz3. As viewed from above, the resistor section Rz3 lies between the lower yoke 42B3 and the upper yoke 42T3.

The lower yoke 42B4 and the upper yoke 42T4 are located near the resistor section Rz4. The lower yoke 42B4 is located closer to the top surface 51a of the substrate 51 than the resistor section Rz4. The upper yoke 42T4 is located farther from the top surface 51a of the substrate 51 than the resistor section Rz4. As viewed from above, the resistor section Rz4 lies between the lower yoke 42B4 and the upper yoke 42T4.

The output magnetic field component output by the magnetic field conversion section 42 contains a magnetic field component that is generated by the lower yoke 42B1 and the upper yoke 42T1 and applied to the resistor section Rz1, a magnetic field component that is generated by the lower yoke 42B2 and the upper yoke 42T2 and applied to the resistor section Rz2, a magnetic field component that is generated by the lower yoke 42B3 and the upper yoke 42T3 and applied to the resistor section Rz3, and a magnetic field component that is generated by the lower yoke 42B4 and the upper yoke 42T4 and applied to the resistor section Rz4.

In FIG. 11, the four hollow arrows indicate the direction of the magnetic field components applied to the resistor sections Rz1, Rz2, Rz3 and Rz4 when the third component of the target magnetic field is in the Z direction. On the other hand, in FIG. 11 the four filled arrows indicate the magnetization directions of the magnetization pinned layers 102 of the MR elements 100 of the resistor sections Rz1, Rz2, Rz3 and Rz4, respectively. The magnetization directions of the magnetization pinned layers 102 of the MR elements 100 of the resistor sections Rz1 and Rz4 are the same as the directions of the magnetic field components that are applied to the resistor sections Rz1 and Rz4, respectively, when the third component of the target magnetic field is in the Z direction. The magnetization directions of the magnetization pinned layers 102 of the MR elements 100 of the resistor sections Rz2 and Rz3 are opposite to the directions of the magnetic field components that are applied to the resistor sections Rz2 and Rz3, respectively, when the third component of the target magnetic field is in the Z direction.

Now, the function of the third magnetic sensor 30 will be described. When there is no third component of the target magnetic field, the magnetization direction of the free layer 104 of each MR element 100 in the resistor sections Rz1, Rz2, Rz3 and Rz4 is perpendicular to the magnetization direction of the magnetization pinned layer 102.

If the third component of the target magnetic field is in the Z direction, the magnetization direction of the free layer 104 of each MR element 100 in the resistor sections Rz1 and Rz4 tilts toward the magnetization direction of the magnetization pinned layer 102 from the direction perpendicular to the magnetization direction of the magnetization pinned layer 102. On the other hand, the magnetization direction of the free layer 104 of each MR element 100 in the resistor sections Rz2 and Rz3 tilts toward a direction opposite to the magnetization direction of the magnetization pinned layer 102 from the direction perpendicular to the magnetization direction of the magnetization pinned layer 102. As a result, the resistor sections Rz1 and Rz4 decrease in resistance while the resistor sections Rz2 and Rz3 increase in resistance, compared to when there is no third component of the target magnetic field.

In contrast to this, if the third component of the target magnetic field is in the −Z direction, the resistor sections Rz1 and Rz4 increase in resistance while the resistor sections Rz2 and Rz3 decrease in resistance, compared to when there is no third component of the target magnetic field.

The amount of change in the resistance of each of the resistor sections Rz1, Rz2, Rz3 and Rz4 depends on the strength of the third component of the target magnetic field.

Changes in the direction and strength of the third component of the target magnetic field cause the resistor sections Rz1, Rz2, Rz3 and Rz4 to change in resistance such that the resistor sections Rz1 and Rz4 increase in resistance while the second and third resistor sections Rz2 and Rz3 decrease in resistance, or such that the resistor sections Rz1 and Rz4 decrease in resistance while the resistor sections Rz2 and Rz3 increase in resistance. This causes a change in a potential difference between the output terminals Vz+ and Vz−. It is thus possible to detect the third component of the target magnetic field based on the potential difference. The third magnetic sensor 30 generates the third detection signal Sz corresponding to the potential difference between the output terminals Vz+ and Vz−. The third detection signal Sz may be one obtained by adjusting the amplitude or offset of the potential difference between the output terminals Vz+ and Vz−.

Reference is now made to FIG. 12 to describe an example structure of the first to third magnetic sensors 10, 20 and 30. FIG. 12 shows a portion of each of the first to third magnetic sensors 10, 20 and 30. In this example, the first to third magnetic sensors 10, 20 and 30 are disposed on the substrate 51. The substrate 51 has the top surface 51a and the bottom surface 51b.

The first magnetic sensor 10 includes insulating layers 66A, 67A and 68A each formed of an insulating material, in addition to the resistor sections Rx1, Rx2, Rx3 and Rx4. The insulating layer 66A lies on the top surface 51a of the substrate 51. The resistor sections Rx1, Rx2, Rx3 and Rx4 are arranged on the insulating layer 66A. FIG. 12 shows one of the plurality of MR elements 100 included in the resistor sections Rx1, Rx2, Rx3 and Rx4, and also the upper connection layer 112 and the lower connection layer 111 connected to the MR element 100. The insulating layer 67A lies on the top surface of the insulating layer 66A and surrounds the resistor sections Rx1, Rx2, Rx3 and Rx4. The insulating layer 68A covers the resistor sections Rx1, Rx2, Rx3 and Rx4 and the insulating layer 67A.

The second magnetic sensor 20 is structurally similar to the first magnetic sensor 10. More specifically, the second magnetic sensor 20 includes insulating layers 66B, 67B and 68B each formed of an insulating material, in addition to the resistor sections Ry1, Ry2, Ry3 and Ry4. The insulating layer 66B lies on the top surface 51a of the substrate 51. The resistor sections Ry1, Ry2, Ry3 and Ry4 are arranged on the insulating layer 66B. FIG. 12 shows one of the plurality of MR elements 100 included in the resistor sections Ry1, Ry2, Ry3 and Ry4, and also the upper connection layer 112 and the lower connection layer 111 connected to the MR element 100. The insulating layer 67B lies on the top surface of the insulating layer 66B and surrounds the resistor sections Ry1, Ry2, Ry3 and Ry4. The insulating layer 68B covers the resistor sections Ry1, Ry2, Ry3 and Ry4 and the insulating layer 67B.

The third magnetic sensor 30 includes insulating layers 61, 62, 63 and 64 each formed of an insulating material, in addition to the resistor sections Rz1, Rz2, Rz3 and Rz4 and the soft magnetic structure 40. In the example illustrated in FIG. 12, the soft magnetic structure 40 includes the magnetic field conversion section 42 and two soft magnetic layers 41 and 43.

The magnetic field conversion section 42 includes the lower yokes 42B1, 42B2, 42B3 and 42B4 and the upper yokes 42T1, 42T2, 42T3 and 42T4 illustrated in FIG. 11. In FIG. 12, one of the lower yokes 42B1, 42B2, 42B3 and 42B4 is denoted by the reference symbol 42B, and a corresponding one of the upper yokes 42T1, 42T2, 42T3 and 42T4 is denoted by the reference symbol 42T.

The soft magnetic layer 41 lies on the top surface 51a of the substrate 51. The lower yokes 42B1, 42B2, 42B3 and 42B4 are arranged on the soft magnetic layer 41. The insulating layer 61 lies on the soft magnetic layer 41 and surrounds the lower yokes 42B1, 42B2, 42B3 and 42B4.

The resistor sections Rz1, Rz2, Rz3 and Rz4 are arranged on the insulating layer 61. FIG. 12 shows one of the plurality of MR elements 100 included in the resistor sections Rz1, Rz2, Rz3 and Rz4, and also the upper connection layer 112 and the lower connection layer 111 connected to the MR element 100. The insulating layer 62 lies on the lower yokes 42B1, 42B2, 42B3 and 42B4 and the insulating layer 61, and surrounds the resistor sections Rz1, Rz2, Rz3 and Rz4.

The upper yokes 42T1, 42T2, 42T3 and 42T4 are arranged on the insulating layer 62. The insulating layer 63 lies on the resistor sections Rz1, Rz2, Rz3 and Rz4 and the insulating layer 62, and surrounds the upper yokes 42T1, 42T2, 42T3 and 42T4.

The soft magnetic layer 43 lies on the upper yokes 42T1, 42T2, 42T3 and 42T4 and the insulating layer 63. The insulating layer 64 covers the soft magnetic layer 43.

As viewed from above, the soft magnetic layers 41 and 43 extend across the entire area or almost the entire area of the third magnetic sensor 30. In other words, both of an area formed by vertically projecting the soft magnetic layer 41 onto the reference plane RP and an area formed by vertically projecting the soft magnetic layer 43 onto the reference plane RP coincide with or almost coincide with the third area A30.

In the example illustrated in FIG. 12, all the magnetic detection elements or MR elements 100 included in the first to third magnetic sensors 10, 20 and 30 are located at the same distance from the top surface 51a of the substrate 51, i.e., the reference plane RP.

The magnetic field conversion section 42 may include only either the lower yokes 42B1, 42B2, 42B3 and 42B4 or the upper yokes 42T1, 42T2, 42T3 and 42T4. The soft magnetic structure 40 may include only either one of the soft magnetic layers 41 and 43.

Next, the first processor 7 and the second processor 8 will be described with reference to FIG. 4. The first processor 7 performs the first processing. The first processing includes sphere information reception and storage processing and offset change detection processing. The first processor 7 includes an offset change detection section 71 that performs the offset change detection processing, and a sphere information reception and storage section 72 that performs the sphere information reception and storage processing.

The second processor 8 performs the second processing. The second processing includes sphere information generation processing, sphere information transmission processing, offset correction processing, and position information generation processing. The second processor 8 includes an offset correction section 81 that performs the offset correction processing, a sphere information generation section 82 that performs the sphere information generation processing, a sphere information transmission section 83 that performs the sphere information transmission processing, and position information generation section 84 that performs the position information generation processing.

The offset change detection section 71, the sphere information reception and storage section 72, the offset correction section 81, the sphere information generation section 82, the sphere information transmission section 83, and the position information generation section 84 are functional blocks for performing the respective processing described above.

The first processor 7 further includes analog-to-digital converters (hereinafter referred to as A/D converters) 70A, 70B, and 70C. The A/D converters 70A, 70B, and 70C convert the first, second, and third detection signals Sx, Sy, and Sz into digital form, respectively. The first to third detection signals Sx, Sy, and Sz converted into digital form are input to the offset change detection section 71, the offset correction section 81, and the sphere information generation section 82.

The sphere information reception and storage processing, the offset change detection processing, the sphere information generation processing, the sphere information transmission processing, the offset correction processing, and the position information generation processing are each repeated during use of the position detection device 1.

Here, coordinates (Sx, Sy, Sz) representing a set of values of the first to third detection signals Sx, Sy, and Sz at a certain timing in the foregoing reference coordinate system are taken as a measurement point. As described above, a change in the relative position of the magnetic field generator 2 with respect to the magnetic sensor device 4 causes the position of the magnetic field generator 2 in the reference coordinate system to change along a predetermined spherical surface. Accordingly, if a plurality of measurement points at a plurality of timings are obtained and plotted on the reference coordinate system, the distribution of the plurality of measurement points can be approximated by a spherical surface. In the present embodiment, the spherical surface approximating the distribution of the plurality of measurement points will be referred to as an approximate spherical surface. The plurality of measurement points are distributed over the approximate spherical surface or near the approximate spherical surface. Sphere information Ss includes data on the center coordinates and the radius of a virtual sphere having the approximate spherical surface.

The sphere information reception and storage processing by the sphere information reception and storage section 72 includes receiving and storing the sphere information Ss transmitted from the second processor 8.

Offsets occur in the first to third detection signals Sx, Sy, and Sz due to factors other than the target magnetic field which is a magnetic field generated by the magnetic field generator 2. The offset change detection processing by the offset change detection section 71 includes detecting a change in the offsets of the first to third detection signals Sx, Sy, and Sz by using the first to third detection signals Sx, Sy, and Sz and the sphere information Ss stored by the sphere information reception and storage processing, and outputting a notification signal Sn indicating the change in the offsets upon detection of the change.

The sphere information generation processing by the sphere information generation section 82 includes generating the sphere information Ss by computation using the first to third detection signals Sx, Sy, and Sz. The sphere information Ss, i.e., the center coordinates and the radius of the virtual sphere may be determined by, for example, determining an approximate spherical surface including four measurement points by using the four measurement points and an equation of the spherical surface. Alternatively, the center coordinates and the radius of the virtual sphere may be determined by determining an approximate spherical surface closest to five or more measurement points by using the five or more measurement points, the equation of the spherical surface, and the least squares method. In the present embodiment, specifically, the sphere information generation processing includes receiving the notification signal Sn output by the offset change detection processing of the first processor 7, and starting to generate latest sphere information Ss upon receiving the notification signal Sn.

The sphere information transmission processing by the sphere information transmission section 83 includes transmitting the sphere information Ss generated by the sphere information generation processing to the first processor 7 after the execution of the sphere information generation processing.

Before the sphere information generation processing is executed for the first time after the position detection device 1 starts to be used, the first and second processors 7 and 8 may perform the following initial processing. In the initial processing, the sphere information transmission section 83 transmits initial sphere information to the first processor 7. The initial sphere information includes data on the initial values of the center coordinates of the foregoing virtual sphere and the initial value of the radius of the virtual sphere. For example, the data on the initial values of the center coordinates and the initial value of the radius is determined before shipment of an apparatus including the joint mechanism 300, on the basis of the configuration of the joint mechanism 300 to which the position detection device 1 is applied. The sphere information reception and storage section 72 receives and stores the initial sphere information. Before the sphere information generation processing is executed for the first time, the offset change detection section 71 detects a change in the offsets by using the initial sphere information instead of the sphere information Ss.

The offset correction processing by the offset correction section 81 includes, after the execution of the sphere information generation processing, correcting the offsets of the first to third detection signals Sx, Sy, and Sz to generate first to third corrected signals by using the first to third detection signals Sx, Sy, and Sz and the data on the center coordinates included in the sphere information Ss generated by the sphere information generation processing, and outputting the first to third corrected signals to the position information generation section 84. Before the sphere information generation processing is executed for the first time, the offset correction section 81 may perform the offset correction processing by using the data on the initial values of the center coordinates instead of the data on the center coordinates.

The position information generation processing by the position information generation section 84 includes generating the position information indicating the relative position of the magnetic field generator 2 with respect to the magnetic sensor device 4 on the basis of the first to third corrected signals.

Upon detection of a change in the offsets, the offset change detection section 71 outputs the notification signal Sn to the sphere information generation unit 82 and stops the offset change detection processing. The sphere information generation processing by the sphere information generation unit 82 includes starting to generate latest sphere information Ss if the notification signal Sn is received. The sphere information reception and storage processing by the sphere information reception and storage section 72 includes updating the stored sphere information Ss if new sphere information Ss is received. If the sphere information Ss is updated by the sphere information reception and storage section 72 after the output of the notification signal Sn, the offset change detection section 71 resumes the offset change detection processing.

The offset correction processing by the offset correction section 81 and the position information generation processing by the position information generation section 84 will now be described concretely. In the following description, the first corrected signal, the second corrected signal, and the third corrected signal will be denoted by the symbols CSx, CSy, and CSz, respectively. The center coordinates of the virtual sphere will be expressed as (cx, cy, cz).

As described above, the position of the magnetic field generator 2 in the reference coordinate system changes along the predetermined spherical surface, and the plurality of measurement points are distributed over the approximate spherical surface or near the approximate spherical surface. The center of the predetermined spherical surface coincides or almost coincides with the center of the first spherical surface, i.e., the reference position. Without an offset, the center coordinates (cx, cy, cz) of the virtual sphere having the approximate spherical surface therefore coincide or almost coincide with the reference position. However, if offsets occur, the center coordinates (cx, cy, cz) of the virtual sphere deviate from the reference position.

The point of origin of the reference coordinate system may be the reference position. In such a case, for example, the offset correction processing may be processing for converting a measurement point (Sx, Sy, Sz) into a point (Sx−cx, Sy−cy, Sz−cz) so that the center coordinates (cx, cy, cz) of the virtual sphere computed in the sphere information generation processing become the point of origin (0, 0, 0) of the reference coordinate system. Here, the first to third corrected signals CSx, CSy, and CSz are expressed by the following Eqs. (1) to (3), respectively.

$$CSx = Sx - cx \quad (1)$$

$$CSy = Sy - cy \quad (2)$$

$$CSz = Sz - cz \quad (2)$$

A point (CSx, CSy, CSz) in the reference coordinate system has a correspondence with the coordinates of the magnetic field generator 2 in the reference coordinate system. For example, the position information generation processing may be processing for determining the coordinates of the magnetic field generator 2 in the reference coordinate system by correcting the components of the point (CSx, CSy, CSz), i.e., the first to third corrected signals CSx, CSy, and CSz. The first to third corrected signals CSx, CSy, and CSz are corrected by, for example, multiplying the first to third corrected signals CSx, CSy, and CSz by respective predetermined correction coefficients so that the distance from the point of origin to the point (CSx, CSy, CSz) in the reference coordinate system becomes equal to the actual distance from the magnetic sensor device 4 to the magnetic field generator 2.

Next, the offset change detection processing by the offset change detection section 71 will be described concretely. In the following description, the radius of the virtual sphere will be denoted by the symbol r.

In the offset change detection processing, a determination that the offsets have changed is made in the following manner, for example. First, a set of values of the first to third detection signals Sx, Sy, and Sz at a certain timing is obtained to obtain the foregoing measurement point (Sx, Sy, Sz). The sphere information Ss stored by the sphere information reception and storage section 72 is also obtained. Next, obtained are a distance between the measurement point (Sx, Sy, Sz) and the center coordinates (cx, cy, cz) of the virtual sphere included in the sphere information Ss, and a difference D between the foregoing distance and the radius r of the virtual sphere included in the sphere information Ss. The difference D is expressed by the following Eq. (4).

$$D = \sqrt{((Sx-cx)^2 + (Sy-cy)^2 + (Sz-cz)^2)} - r \quad (4)$$

Next, the absolute value of the difference D is compared with a predetermined threshold. The predetermined threshold is a threshold for detecting a change in the offsets. In the offset change detection processing, if the absolute value of the difference D is greater than or equal to the predetermined threshold, it is determined that the offsets have changed, and the notification signal Sn is output.

The timing at which the offset change detection section 71 obtains a set of values of the first to third detection signals Sx, Sy, and Sz is synchronized with the sampling period of the first processor 7. The offset change detection section 71 may perform the offset change detection processing each time the offset change detection section 71 obtains a set of values of the first to third detection signals Sx, Sy, and Sz. In such a case, the shorter the sampling period of the first processor 7, the shorter the execution interval of the offset change detection processing.

Figure 13:
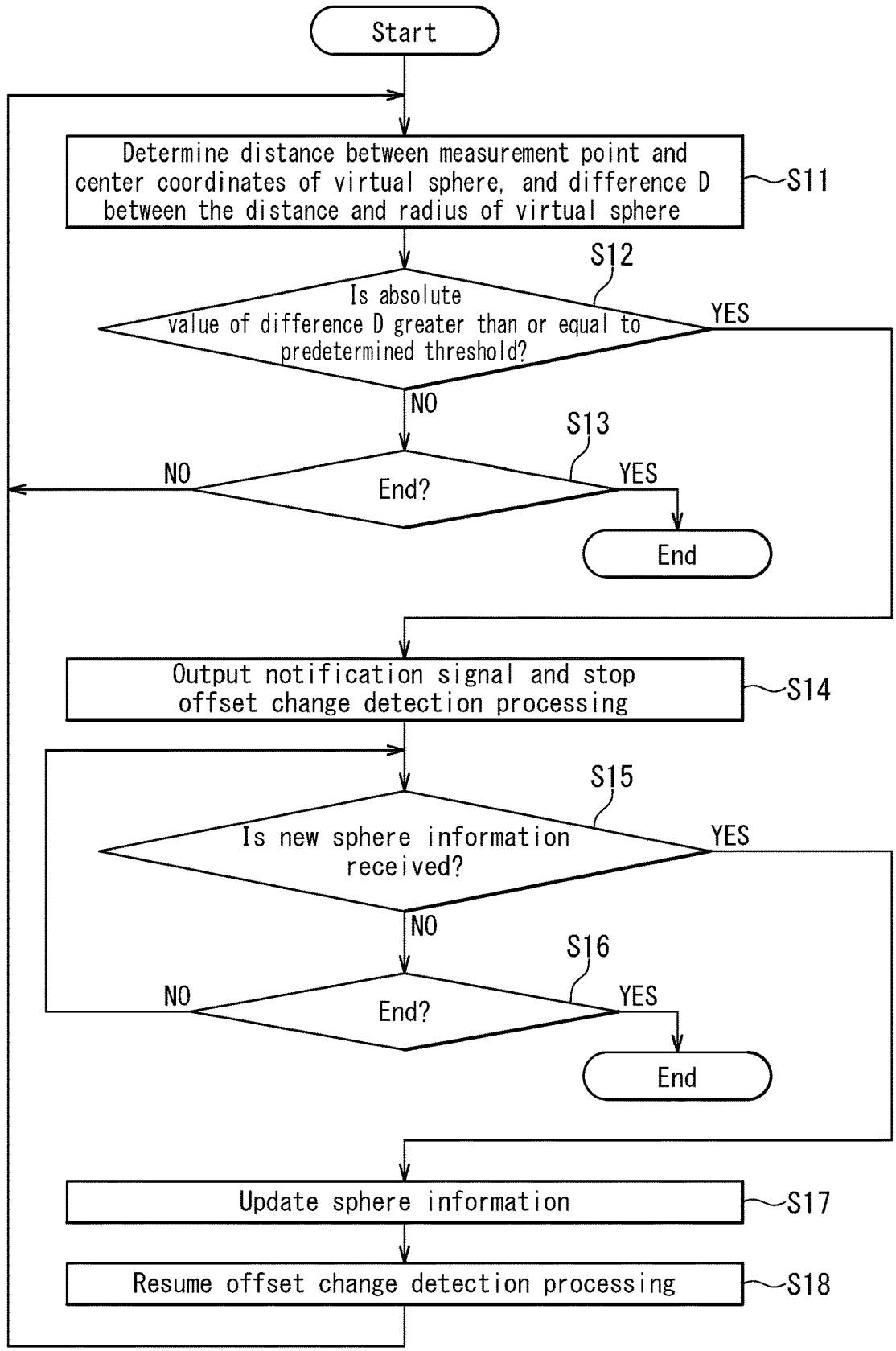
FIG. 13 is a flowchart illustrating the operation of a first processor of the embodiment of the invention.

Next, an operation of the first processor 7 related to the offset change detection processing and the sphere information reception and storage processing will be described with reference to FIG. 13. FIG. 13 is a flowchart illustrating the operation of the first processor 7. In the operation illustrated in FIG. 13, first, the offset change detection section 71 determines the distance between the measurement point based on the first to third detection signals Sx, Sy, and Sz and the center coordinates included in the sphere information Ss, and the difference D between the distance and the radius r included in the sphere information Ss (step S11) as described above.

Next, the offset change detection section 71 determines whether the absolute value of the difference D is greater than or equal to the predetermined threshold (step S12). If it is determined in step S12 that the absolute value of the difference D is not greater than or equal to the predetermined threshold (NO), the first processor 7 determines whether to end the operation illustrated in FIG. 13 (step S13). If it is determined to end the operation (YES) in step S13, the operation illustrated in FIG. 13 is ended. For example, the operation illustrated in FIG. 13 is ended if a signal indicating an end is input to the first processor 7. If it is determined not to end the operation (NO) in step S13, the processing returns to step S11. If it is determined in step S12 that the absolute value of the difference D is greater than or equal to the predetermined threshold (YES), the offset change detection section 71 outputs the notification signal Sn and stops the offset change detection processing (step S14).

In the operation illustrated in FIG. 13, the sphere information reception and storage section 72 then checks whether new sphere information Ss is received (step S15). If it is confirmed in step S15 that no new sphere information Ss is received (NO), the first processor 7 determines whether to end the operation illustrated in FIG. 13 (step S16). If it is determined to end the operation (YES) in step S16, the operation illustrated in FIG. 13 is ended. If it is determined not to end the operation (NO) in step S16, step S15 is executed again after a lapse of a predetermined time. If it is confirmed in step S15 that new sphere information Ss is received (YES), the sphere information reception and storage section 72 updates the stored sphere information Ss (step S17).

In the operation illustrated in FIG. 13, the offset change detection section 71 then resumes the offset change detection processing (step S18). The processing returns to step S11.

Figure 14:
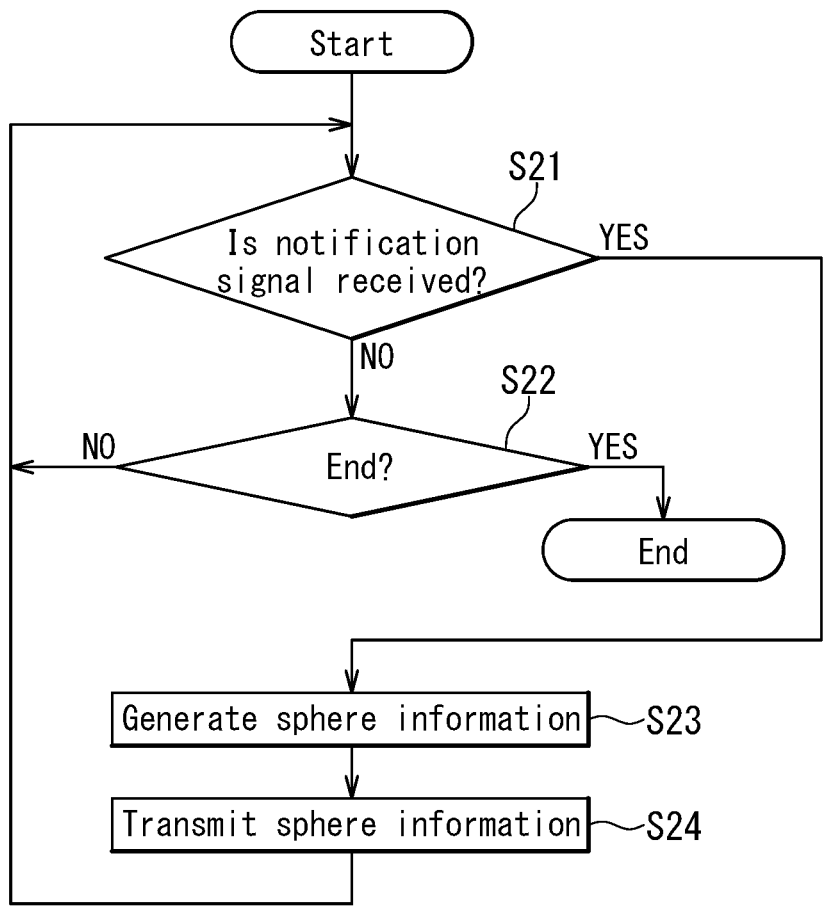
FIG. 14 is a flowchart illustrating the operation of a second processor of the embodiment of the invention.

Next, an operation of the second processor 8 related to the generation and transmission of the sphere information Ss will be described with reference to FIG. 14. FIG. 14 is a flowchart illustrating the operation of the second processor 8 related to the generation and transmission of the sphere information Ss. In the operation illustrated in FIG. 14, first, the sphere information generation section 82 checks whether the notification signal Sn is received (step S21). If it is confirmed in step S21 that the notification signal Sn is not received (NO), the second processor 8 determines whether to end the operation illustrated in FIG. 14 (step S22). If it is determined to end the operation (YES) in step S22, the operation illustrated in FIG. 14 is ended. For example, the operation illustrated in FIG. 14 is ended if a signal indicating an end is input to the second processor 8. If it is determined not to end the operation (NO) in step S22, step S21 is executed again after a lapse of a predetermined time.

If it is confirmed in step S21 that the notification signal Sn is received (YES), the sphere information generation section 82 generates sphere information Ss (step S23). Next, the sphere information transmission section 83 transmits the sphere information Ss to the sphere information reception and storage section 72 (step S24). In the operation illustrated in FIG. 14, the processing returns to step S21 after the execution of step S24.

In the position detection device 1, the signal processing circuit 5 and the magnetic sensor system 3 according to the present embodiment, as described above, the first processor 7 detects a change in the offsets of the first to third detection signals Sx, Sy, and Sz by using the sphere information Ss generated by the second processor 8, without performing the processing for generating the sphere information Ss by itself. The processing for generating the sphere information Ss needs relatively complicated computations and a considerable amount of time. The present embodiment thus enables quicker detection of a change in the offsets of the first to third detection signals Sx, Sy, and Sz, compared to the case where the first processor 7 performs the processing for generating the sphere information Ss by itself and performs the offset change detection processing using the sphere information Ss.

The present embodiment makes it possible to reduce the load on the first processor 7 and thereby increase the frequency of execution of the offset change detection processing, compared to the case where the first processor 7 performs the processing for generating the sphere information Ss by itself. As a result, it becomes possible to detect a change in the offsets of the first to third detection signals Sx, Sy, and Sz more quickly.

As described above, to determine the sphere information Ss, i.e., the center coordinates and radius of the virtual sphere, at least four measurement points are needed. In contrast, according to the present embodiment, the offset change detection processing is performed by comparing the absolute value of the difference D with the predetermined threshold as described above. Eq. (4) shows that only a single measurement point is required for computing the difference D. According to the present embodiment, it is thus possible to perform the offset change detection processing each time a measurement point is obtained. This also contributes to increasing the frequency of execution of the offset change detection processing according to the present embodiment, compared to the case where the first processing 7 performs the processing for generating the sphere information Ss by itself and performs the offset change detection processing using the sphere information Ss. As a result, it becomes possible to detect a change in the offsets of the first to third detection signals Sx, Sy, and Sz more quickly.

In the present embodiment, the sphere information generation processing starts to generate latest sphere information Ss if the notification signal Sn is received. In the present embodiment, the frequency of execution of the sphere information generation processing is thus lower than that of execution of the offset change detection processing. According to the present embodiment, the load on the second processor 8 can thus be reduced.

The present invention is not limited to the foregoing embodiments, and various modifications may be made thereto. For example, the signal processing circuit and the magnetic sensor system of the present invention are applicable not only to detection of the relative position of the magnetic field generator with respect to the magnetic sensor device but also to detection of the orientation of the magnetic sensor device configured to be rotatable in a predetermined magnetic field.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A magnetic sensor system comprising:
a magnetic sensor device; and
a signal processing circuit, wherein
the magnetic sensor device is configured to generate a first detection signal, a second detection signal, and a third detection signal that have correspondences with components in three mutually different directions of a magnetic field at a reference position,
the signal processing circuit includes a first processor and a second processor, the first processor being provided between the magnetic sensor device and the second processor in a circuit configuration of the magnetic sensor system,
the second processor is configured to:
generate sphere information by computation using the first to third detection signals, wherein when coordinates representing a set of values of the first to third detection signals at a certain timing in an orthogonal coordinate system defined by three axes for expressing the values of the first to third detection signals are taken as a measurement point, the sphere information includes data on center coordinates and a radius of a virtual sphere having a spherical surface approximating a distribution of a plurality of measurement points at a plurality of timings; and
correct offsets of the first to third detection signals to generate first to third corrected signals by using the first to third detection signals and the data on the center coordinates included in the sphere information, the first processor and the second processor are configured such that the sphere information is transmitted from the second processor to the first processor, the first processor is configured to:
store the sphere information; and
detect a change in offsets of the first to third detection signals by using the first to third detection signals and the sphere information, and output a notification signal indicating the change in the offsets upon detection of the change, and the first processor includes a storage section that stores the sphere information.

2. The magnetic sensor system according to claim 1, wherein the first processor determines a distance between the measurement point based on the first to third detection signals and the center coordinates included in the sphere information stored by the storage section, and determines that the offsets have changed and outputs the notification signal if a difference between the distance and the radius included in the sphere information stored by the storage section has an absolute value greater than or equal to a predetermined threshold.

3. The magnetic sensor system according to claim 1, wherein the second processor receives the notification signal output by the first processor, and starts to generate latest sphere information upon receiving the notification signal.

4. The magnetic sensor system according to claim 1, wherein the magnetic sensor device includes a first magnetic sensor for generating the first detection signal, a second magnetic sensor for generating the second detection signal, and a third magnetic sensor for generating the third detection signal.

5. The magnetic sensor system according to claim 1, wherein the first processor is integrated with the magnetic sensor device, and the second processor is separate from the magnetic sensor device and the first processor.

6. A signal processing circuit for processing a first detection signal, a second detection signal, and a third detection signal that have correspondences with components in three mutually different directions of a magnetic field at a reference position, the first to third detection signals being output from a magnetic sensor device that generates the first to third detection signals, the signal processing circuit comprising:
a first processor; and
a second processor, the first processor being provided between the magnetic sensor device and the second processor in a circuit configuration of the signal processing circuit, the second processor is configured to:
generate sphere information by computation using the first to third detection signals, wherein when coordinates representing a set of values of the first to third detection signals at a certain timing in an orthogonal coordinate system defined by three axes for expressing the values of the first to third detection signals are taken as a measurement point, the sphere information includes data on center coordinates and a radius of a virtual sphere having a spherical surface approximating a distribution of a plurality of measurement points at a plurality of timings; and
correct offsets of the first to third detection signals to generate first to third corrected signals by using the first to third detection signals and the data on the center coordinates included in the sphere information, the first processor and the second processor are configured such that the sphere information is transmitted from the second processor to the first processor, the first processor is configured to:
store the sphere information; and
detect a change in offsets of the first to third detection signals by using the first to third detection signals and the sphere information, and output a notification signal indicating the change in the offsets upon detection of the change, and the first processor includes a storage section that stores the sphere information.

7. The signal processing circuit according to claim 6, wherein the first processor determines a distance between the measurement point based on the first to third detection signals and the center coordinates included in the sphere information stored by the storage section, and determines that the offsets have changed and outputs the notification signal if a difference between the distance and the radius included in the sphere information stored by the storage section has an absolute value greater than or equal to a predetermined threshold.

8. The signal processing circuit according to claim 6, wherein the second processor receives the notification signal output by the first processor, and starts to generate latest sphere information upon receiving the notification signal.

* * * * *